United States Patent
Matsuda

(10) Patent No.: US 8,097,951 B2
(45) Date of Patent: Jan. 17, 2012

(54) INTEGRATED CIRCUIT HAVING WIRING LAYER AND A PATTERN IN WHICH A GAP IS FORMED AND METHOD FOR MANUFACTURING SAME

(75) Inventor: Katsushi Matsuda, Mizuho (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 53 days.

(21) Appl. No.: 12/379,793

(22) Filed: Mar. 2, 2009

(65) Prior Publication Data

US 2009/0224373 A1  Sep. 10, 2009

(30) Foreign Application Priority Data

Mar. 4, 2008 (JP) ................. 2008-052894

(51) Int. Cl.
   *H01L 23/48* (2006.01)
   *H01L 23/52* (2006.01)
   *H01L 29/40* (2006.01)
(52) U.S. Cl. .... 257/773; 257/758; 257/775; 257/E23.01
(58) Field of Classification Search .................. 257/758, 257/773, 775, E23.01, 759
See application file for complete search history.

(56) References Cited

U.S. PATENT DOCUMENTS

| 5,932,490 | A | 8/1999 | Manning |
| 6,243,292 | B1 | 6/2001 | Kobayashi et al. |
| 7,301,241 | B2 * | 11/2007 | Watanabe .................. 257/775 |
| 2005/0287800 | A1 * | 12/2005 | Katase et al. ............... 438/652 |

FOREIGN PATENT DOCUMENTS

| JP | A-2000-31338 | 1/2000 |
| JP | A-2001-210808 | 8/2001 |

* cited by examiner

*Primary Examiner* — Minh-Loan T Tran
*Assistant Examiner* — Teresa M Arroyo
(74) *Attorney, Agent, or Firm* — Oliff & Berridge, PLC

(57) ABSTRACT

When an integrated circuit having an interlayer insulation film built up on top of a wiring layer is subjected to a heat treatment, it is unlikely that a void formed in the interlayer insulation film will rupture in a portion wherein are connected a narrow gap between wirings and a wide open part contiguous therewith. A corner part of a wiring positioned at a portion where a gap and an open part are connected is chamfered, and an end part of the gap is shaped so as to widen toward the open part. Providing the widening end part in the gap thus mitigates any discontinuity in the built up interlayer insulation film between the gap and the open part. As a result, the interlayer insulation film does not readily seal off an end of a void formed in the gap.

10 Claims, 5 Drawing Sheets

INTEGRATED CIRCUIT HAVING WIRING LAYER AND A PATTERN IN WHICH A GAP IS FORMED AND METHOD FOR MANUFACTURING SAME

CROSS-REFERENCE TO RELATED APPLICATION

The priority application number JP 2008-052894 upon which this patent application is based is hereby incorporated by reference.

BACKGROUND OF THE INVENTION

1. Field of the Invention

The present invention relates to an integrated circuit formed on a surface of a semiconductor substrate or another substrate, and to a method for manufacturing same; and particularly relates to structures of a wiring layer and an interlayer insulation film laminated thereon.

2. Description of the Related Art

Circuit elements such as transistors, resistors, and capacitors are formed in semiconductor devices in which circuits are integrated on a semiconductor substrate (integrated circuits) using an impurity diffusion region formed on the semiconductor substrate, polysilicon laminated on the substrates, or the like. A metal film is additionally formed as a wiring layer above the circuit elements with an insulation layer interposed therebetween. By patterning the metal film, wirings for establishing connections including connections between circuit elements, and other components are formed.

In designing a wiring pattern, a plurality of wirings is disposed with a minimum amount of space between the wirings in order to, e.g., increase the degree of integration. FIG. 6 is a plan view showing an example of a conventional pattern of a plurality of wirings having portions that are in proximity to each other. Each of two wirings 2 shown in FIG. 6 change direction therealong by 90°. Horizontal portions 2h of the wirings 2 are disposed parallel to and in proximity to each other. Conversely, vertical parts 2v of each of the wirings 2 are disposed across a large amount of space due, e.g., to each of the wirings 2 having a different connection point. The wiring layer is formed, e.g., by vapor-depositing aluminum (Al).

FIG. 7 is a plan view showing another example of a conventional pattern of a plurality of wirings having proximal portions. Two wirings 4a, 4b shown in FIG. 7 are disposed parallel to and in proximity to each other. At an unspecified point along one of the wirings 4a, the other wiring 4b connects via a contact 6 to a diffusion layer of the semiconductor substrate (not shown) or to lower layer wiring (not shown), and terminates.

Once the wiring layer has been completely patterned, there is formed an interlayer insulation film or a passivation film (collectively termed interlayer insulation films in the present application) for covering the wiring layer. For example, tetraethoxysilane (TEOS), borophosphosilicate glass (BPSG), or a silicon nitride film (SiN) is built up using chemical vapor deposition (CVD) or another appropriate method; and an interlayer insulation film is formed. After the interlayer insulation film is built up, a heat treatment can be performed in order to, e.g., planarize the film using a reflow process.

It is possible to laminate another wiring layer on the interlayer insulation film and form wirings, forming a multiple wiring layer structure.

SUMMARY OF THE INVENTION

The portions 8 enclosed by dotted-line circles in FIGS. 6 and 7 are where the two wirings 2 or wirings 4a, 4b cease to be close to each other. FIG. 8 is a plan view of an enlargement of the portion 8 in, e.g., FIG. 7. A gap 10 formed when a narrow trench is patterned into the wiring layer is provided to the portion in which the wirings 4a, 4b are proximally disposed. An open part 12 formed when a wide portion is patterned into the wiring layer can be formed adjacent to a portion in which one of the two proximally disposed wirings changes direction (FIG. 6) or terminates (FIG. 7).

In the prior art, when a heat treatment is performed after the interlayer insulation film has been built up, the interlayer insulation film ruptures in a portion where the gap 10 and the open part 12 are connected. The planarization of the film is compromised, and other problems are presented.

This phenomenon is caused by voids 16 that can form as a result of irregularity in the interlayer insulation film 14 where the gap 10 is located, as shown in FIG. 9. FIG. 9 is a vertical cross-sectional view of the interlayer insulation film and a wiring layer taken along line A-A' in FIG. 8. Such voids 16 are thought to form because irregularity occurs in the interlayer insulation film 14 as a result of valley in the gap 10; and because the interlayer insulation film 14 does not readily build up in the interior part of the narrow gap 10, but can accumulate comparatively quickly near the top edges of the gap 10. Conversely, the interlayer insulation film 14 covers the step formed at the edge of the open part 12, and the small void 16 that appears at the end part of the gap 10 bordering the open part 12 can be sealed off. The phenomenon associated with the abovementioned problems is thought to be due to the end part being damaged by a rise in air pressure inside the void 16 during heat treatment. The reason damage occurs in the end part and not any arbitrary portion of the void 16 is presumably related to factors including the thickness of the interlayer insulation film 14 that closes off the end part, and the strength arising from the shape and other characteristics of the void 16.

The integrated circuit according to the present invention comprises a wiring layer laminated on a substrate and having a pattern in which is formed a gap for forming a narrow trench and a wide open part contiguous with the gap; and an interlayer insulation film built up so as to cover the wiring layer; wherein the pattern of the wiring layer has a corner part present in a portion in which the gap and the open part are connected, the corner part is chamfered, and an end part of the gap is formed in a shape that widens toward the open part.

The present invention minimizes the occurrence of rupturing in the interlayer insulation film in the portion where the gap 10 and the open part 12 are connected.

DESCRIPTION OF THE PREFERRED EMBODIMENTS

Figure 1:
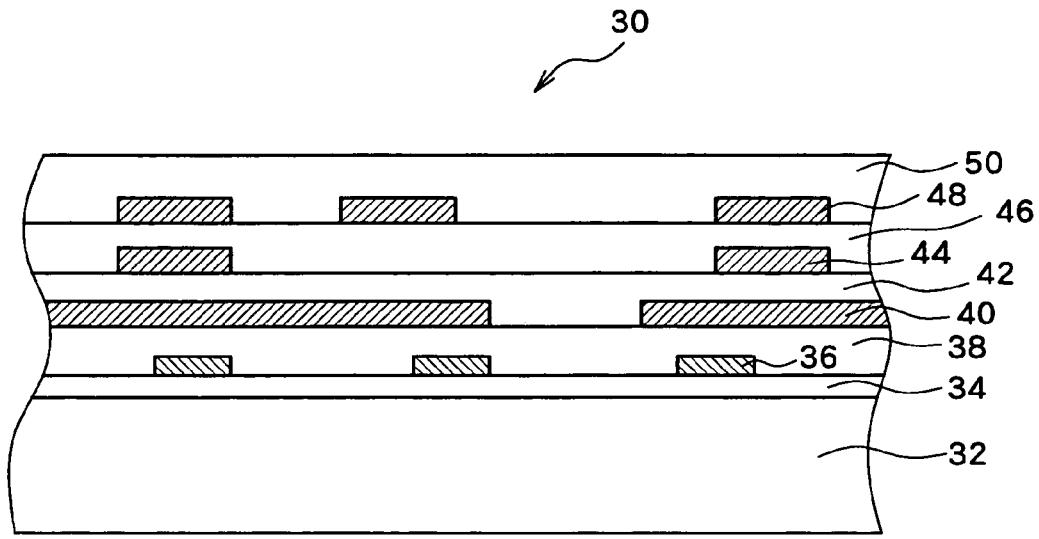
FIG. 1 is a schematic vertical cross-sectional view of an integrated circuit according to an embodiment of the present invention.

Preferred modes for carrying out the present invention (hereinafter referred to as "embodiments") are described hereinbelow with reference to the accompanying drawings. The present embodiment is an integrated circuit having a substrate consisting of semiconductor. FIG. 1 is a schematic vertical cross-sectional view of an integrated circuit 30 according to the embodiment. A diffusion layer (not shown) is formed on a semiconductor substrate 32 using ion implantation or another process; and a silicon oxide film 34 including a gate insulation film, a local oxidation of silicon (LOCOS) film, and the like is subsequently formed on a surface of the semiconductor substrate 32. An electrode 36 comprising a polysilicon layer is formed on a surface of the silicon dioxide film 34, and an interlayer insulation film 38 is laminated thereon.

A metal wiring layer 40, an interlayer insulation film 42, a metal wiring layer 44, an interlayer insulation film 46, a metal wiring layer 48, and a passivation film 50 are in turn laminated on top of the interlayer insulation film 38 in the stated order. The metal wiring layers 40, 44, 48 each comprise a vapor-deposited Al film. Each of the metal wiring layers is patterned into a desired wirings or the like by photolithography method. TEOS, BPSG, or another appropriate substance is built up using chemical vapor deposition; and the interlayer insulation films 42, 46 are formed. SiN, polymide, or another appropriate material is laminated using a chemical vapor deposition method, spin coating, or another appropriate technique; and the passivation film 50 is formed.

Figure 2:
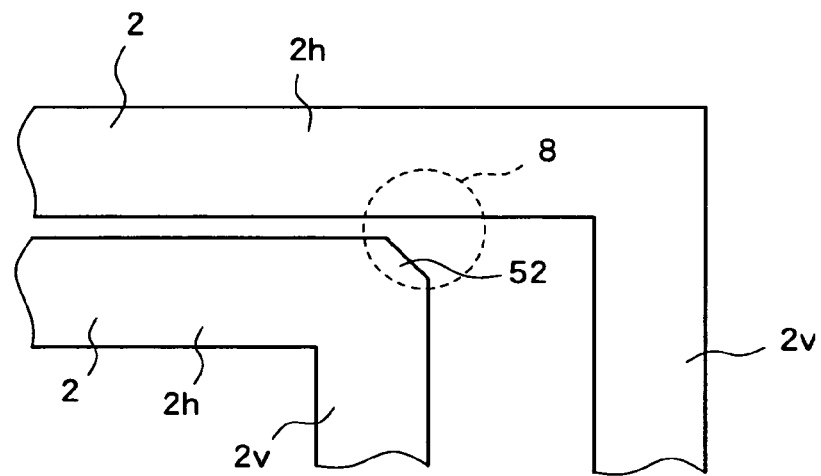
FIG. 2 is a plan view schematically showing one example of a pattern of a plurality of wirings disposed in proximity to each other.
Figure 3:
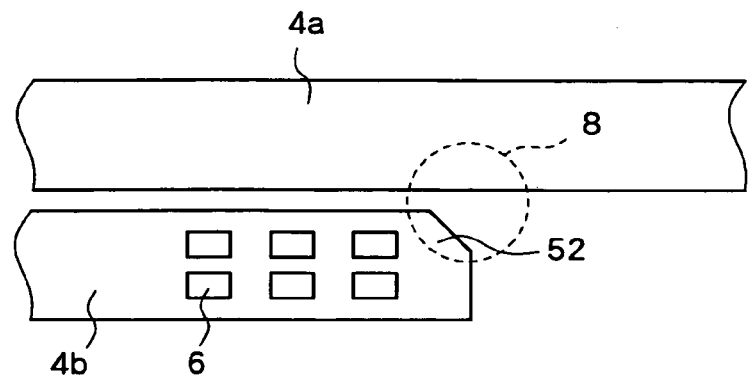
FIG. 3 is a plan view schematically showing another example of a pattern of a plurality of wirings disposed in proximity to each other.

FIGS. 2 and 3 are plan views schematically showing examples of a pattern of a plurality of wirings formed, e.g., using the metal wiring layer 40, and having portions that are in proximity to each other. FIGS. 2 and 3 show patterns in which the present invention has been applied to the conventional wiring layout shown in FIGS. 6 and 7, respectively, for purposes of comparison with the conventional structure mentioned above. In order to make the comparison simpler and more convenient, the same reference symbols are used to designate the same structures in FIGS. 6 and 7.

Figure 6:
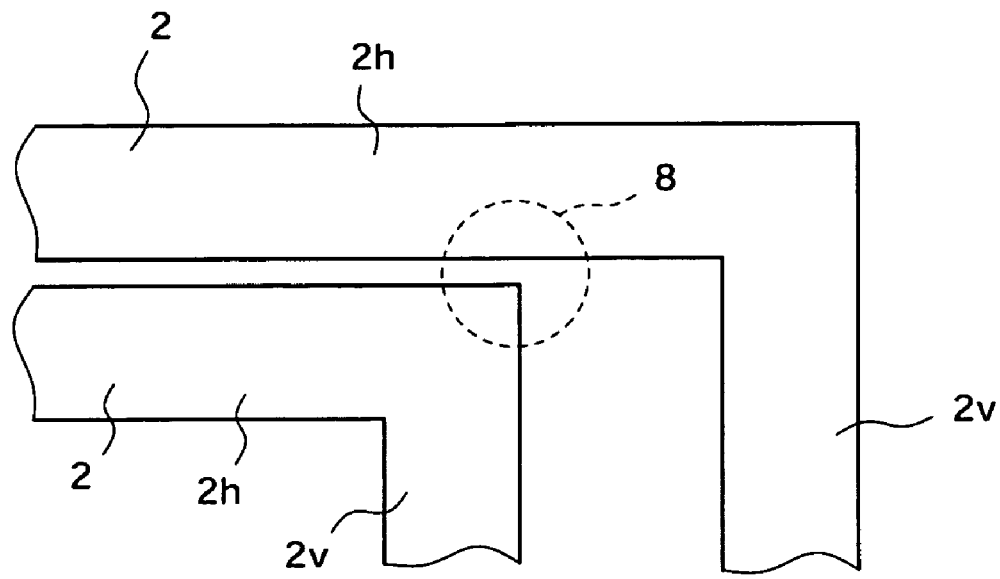
FIG. 6 is a plan view showing one example of a conventional pattern of a plurality of wirings disposed in proximity to each other.
Figure 7:
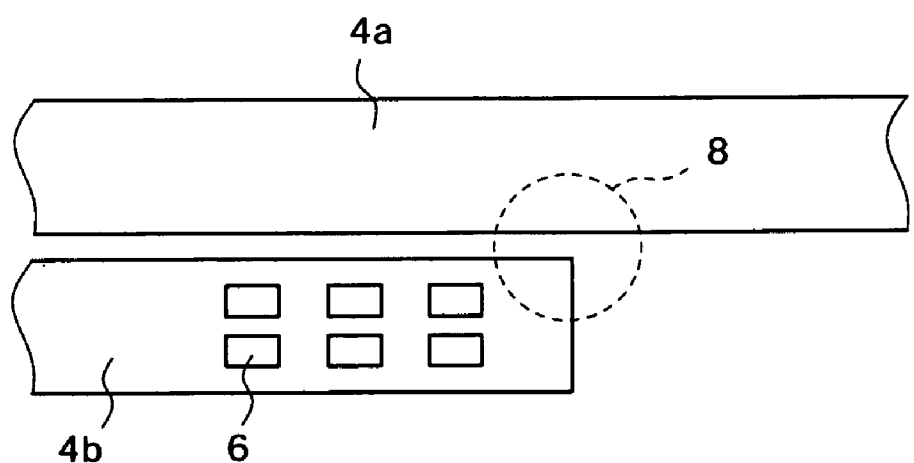
FIG. 7 is a plan view showing another example of a conventional pattern of a plurality of wirings disposed in proximity to each other.
Figure 8:
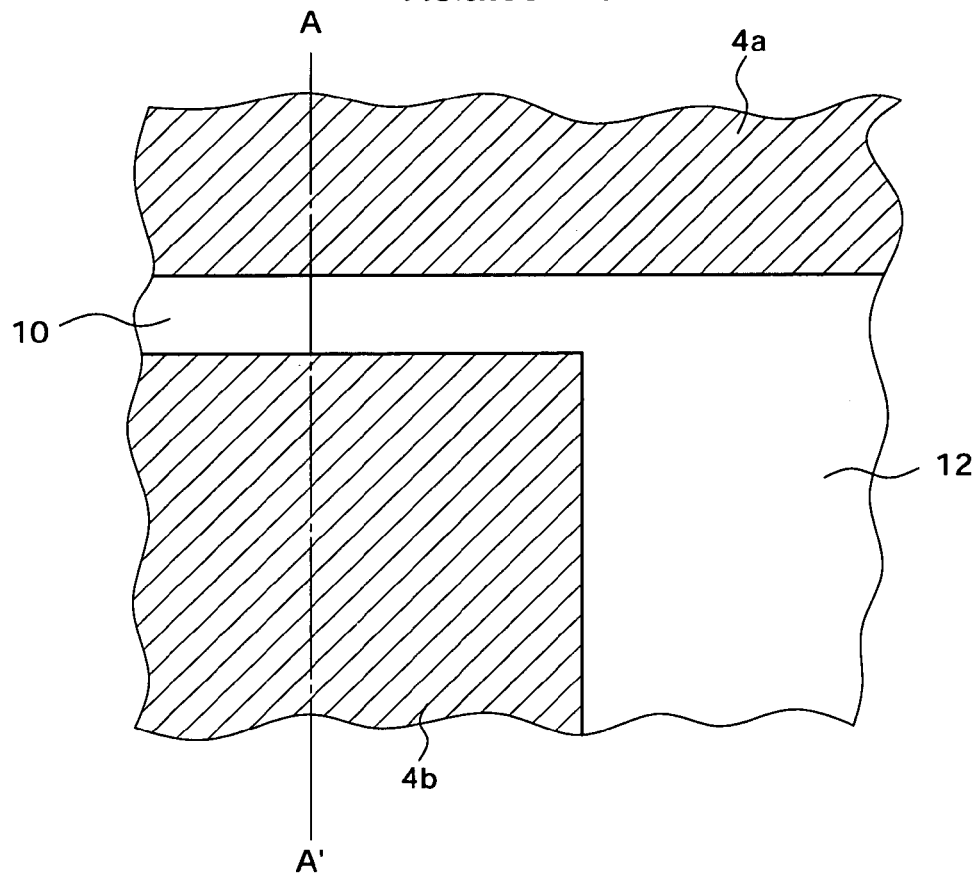
FIG. 8 is a plan view of an enlargement of one part of the wiring pattern shown in FIG. 6 or FIG. 7.
Figure 9:
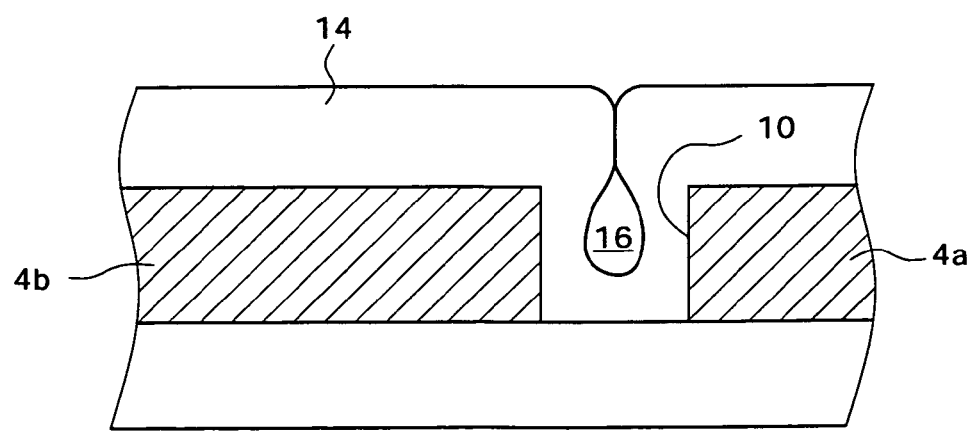
FIG. 9 is a vertical cross-sectional view of an interlayer insulation film and a metal wiring layer taken along the line A-A' in FIG. 8.

The differences between the wiring patterns shown in FIGS. 2 and 3 and the patterns in FIGS. 6 and 7 are found inside portions 8 enclosed by the dotted circles. As mentioned above, the portions 8 are where two wirings 2 or wirings 4a, 4b cease to be close to each other. A corner part 52 of the wiring layer patterns is present in these portions; however, in the present invention, the corner part 52 is chamfered.

Figure 4:
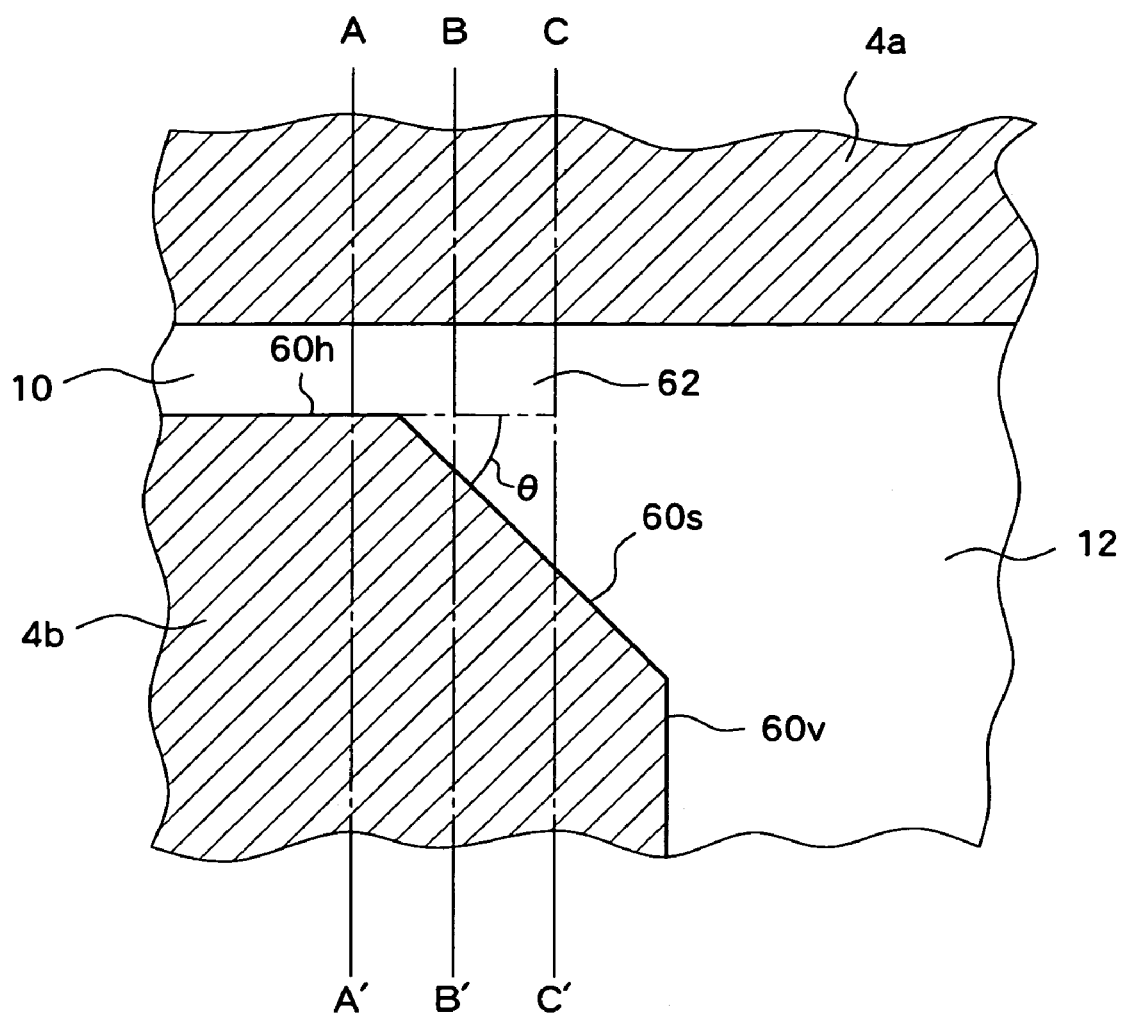
FIG. 4 is a plan view of an enlargement of part of the wiring pattern shown in FIG. 3.

FIG. 4 is a plan view of an enlargement of the portion 8 in, e.g., FIG. 3. A corner part of a wiring 4b is formed in a portion where a gap 10 and an open part 12 are connected, and the corner part is chamfered. A side surface 60s is provided to the wiring 4b between a side surface 60h facing a wiring 4a and a side surface 60v of the wiring 4b, and diagonally crosses each of the side surfaces 60h, 60v. The side surface 60v is a boundary of the open part 12.

An end part 62 that widens into the open part 12 is formed in the gap 10 along the side surface 60s. The angle at which the end part 62 of the gap 10 widens is determined by an angle θ at which the side surface 60s bends away from the side surface 60h (an exterior angle on the planar shape of the wiring 4b). For example, θ can be set to 45°.

Figure 5A:
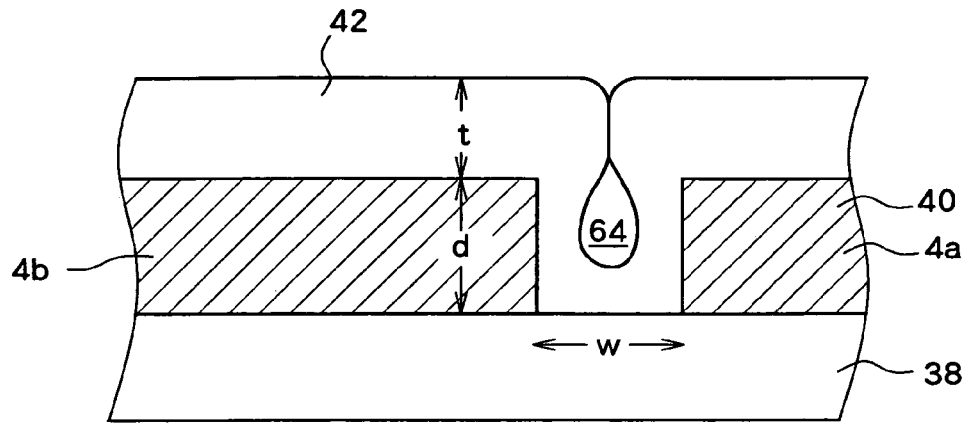
FIG. 5A is a vertical cross-sectional view of an interlayer insulation film and a metal wiring layer taken along line A-A' in FIG. 4.
Figure 5B:
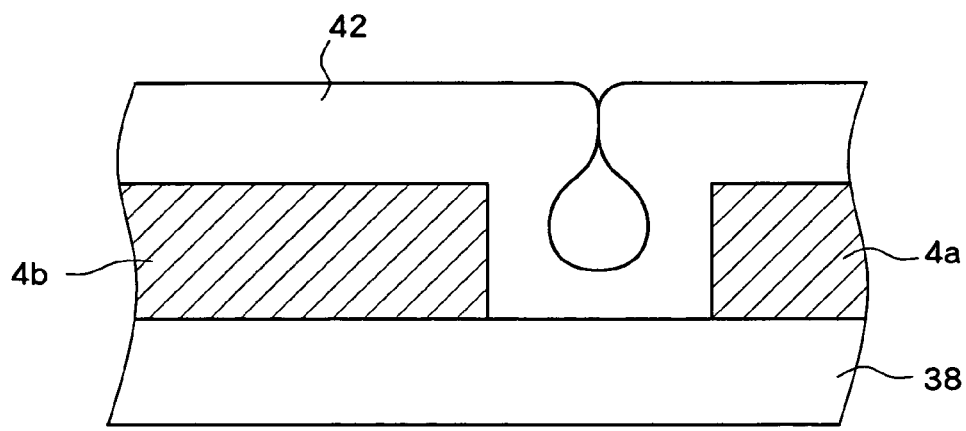
FIG. 5B is a vertical cross-sectional view of an interlayer insulation film and a metal wiring layer taken along the line B-B' in FIG. 4.
Figure 5C:
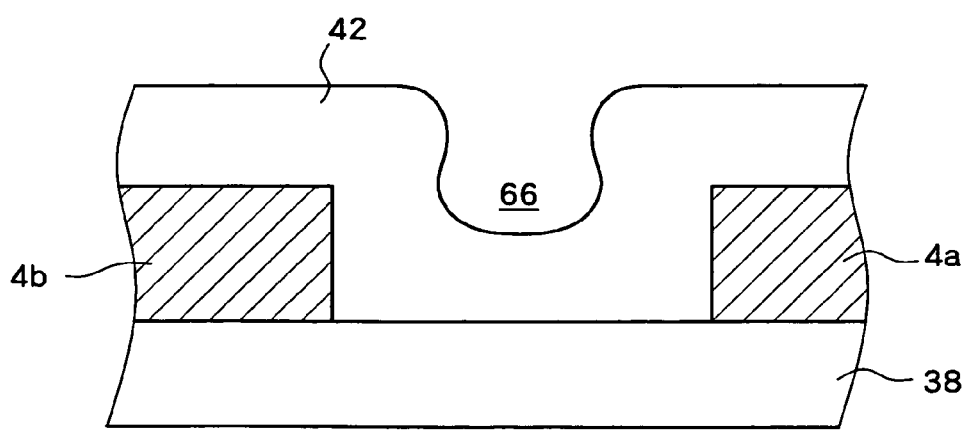
FIG. 5C is a vertical cross-sectional view of an interlayer insulation film and a metal wiring layer taken along the line C-C' in FIG. 4.

FIGS. 5A to 5C are vertical cross-sectional views of the interlayer insulation films 42, 38 and the metal wiring layer 40, taken along lines A-A', B-B', and C-C' in FIG. 4. FIG. 5A shows a cross-section at a position where the wirings 4a, 4b face each other in parallel (line A-A'); FIG. 5B shows a cross-section at a position inside the end part 62 (line B-B'); and FIG. 5C shows a cross-section at a position on the open part 12 side of the end part 62 (line C-C'). Providing the end part 62 causes a width w of a trench formed as the gap 10 between the wirings 4a, 4b to increase closer to the open part 12. A void 64 formed in the interlayer insulation film 42 in correspondence with the gap 10 expands as the width w of the trench increases. As the width w of the trench increases further, the interlayer insulation film 42 cannot close over the upper part of the void 64, and an indentation (recess) 66 in the interlayer insulation film 42 is formed within the gap 10, as shown in FIG. 5C. The indentation leads into a recess of the interlayer insulation film 42 formed inside the open part 12.

Providing the widening end part 62 in the gap 10 thus mitigates any discontinuity between the gap 10 and the open part 12, and prevents the void 64 from being readily sealed off. As a result, the void 64 will tend not to rupture in heat treatments performed after the interlayer insulation film 42 has been laminated, and the interlayer insulation film 42 will be more even.

As shown in FIG. 5A, the aspect ratio of the gap 10 (trench depth d/trench width w) influences whether or not the void 64 in the interlayer insulation film 42 will form in the gap 10. Yet another factor is a thickness t of the interlayer insulation film 42. If tmin is taken as a minimum value of the thickness t of the interlayer insulation film 42 at which the upper part of the gap 10 is obstructed, it is possible that an interlayer insulation film 42 thicker than tmin will obstruct the upper part of the gap 10, the gap 10 will be buried thereunder, and the void 64 will be formed. The thickness tmin is usually presumed to be approximately one-half of the width w.

In order to increase the degree of integration of an integrated circuit, the width w is often set very small; therefore, the aspect ratio is thought to increase in many cases. The ratio tmin/d decreases as the aspect ratio (d/w) increases.

Whereas the thickness of the interlayer insulation film 42 built up in the open part 12 is substantially t, the height of the void 64 from the bottom of the gap 10 remains substantially unchanged after the film thickness exceeds tmin. As a result, the difference in the height of the interlayer insulation film 42 between a bottom part of the void 64 and the open part 12 increases as t increases. The difference in height can make it more likely that the interlayer insulation film 42 will seal off the void 64. To lessen the likelihood of such an occurrence, the end part 62 is lengthened, the angle at which the end part 62 expands (the angle θ in the example shown in FIG. 4) is reduced, and the gradient of the film thickness between the ends of the end part 62 is lowered.

The chamfer is not limited to being linear, as shown by the side surface 60s, and can, e.g., be formed in an arcuate line as viewed from above.

In the abovedescribed embodiment, an example of application of the present invention is described for the first metal wiring layer 40 and the interlayer insulation film 42 built up thereon; however, the present invention can also be applied to the other metal wiring layers. Specifically, applying the present invention to the metal wiring layer 44 makes it possible to minimize rupturing of the interlayer insulation film 46; and if the present invention is applied to the metal wiring layer 48, it will be possible to minimize rupturing of the SiN layer built up by chemical vapor deposition and used as the passivation film.50. It is also possible to apply the present invention to the pattern of the polysilicon layer for forming the electrode 36, and to minimize rupturing of the interlayer insulation film 38. The present invention may be applied without limitation regarding the type of base to be used; e.g., the base may be a sapphire substrate. Furthermore, the present invention can be applied widely to structures obtained by using chemical vapor deposition or another technique to deposit additional layers on a layer having a part in which a very narrow gap is connected to a wide open part.

What is claimed is:

1. An integrated circuit comprising:
   a wiring layer laminated on a substrate and having a pattern in which is formed a gap for forming a narrow trench and a wide open part contiguous with the gap; and
   an interlayer insulation film built up so as to cover the wiring layer; wherein
   the pattern of the wiring layer has a corner part present in a portion in which the gap and the open part are connected, the corner part is chamfered, and an end part of the gap is formed in a shape that widens toward the open part;
   the chamfered corner part has a first edge parallel to the narrow trench, a second edge that is facing the wide open part and is perpendicular to the first edge, and a slanted edge diagonally crossing each of the first edge and the second edge; and
   a width of a part of the gap adjacent to the slanted edge at a position along the gap monotonically increases as the position moves closer to a boundary of the open part defined by an extended line of the second edge.

2. The integrated circuit of claim 1, wherein
   the interlayer insulation film is laminated to a thickness at which all of the gap except the end part is buried beneath the interlayer insulation film.

3. The integrated circuit of claim 2, wherein
   the end part of the gap expands toward the open part up to a width at which the built-up interlayer insulation film forms an indentation inside the gap.

4. The integrated circuit of claim 1, wherein
   a void is formed in the interlayer insulation film at a location that does not include the end part but otherwise corresponds to the gap.

5. The integrated circuit of claim 4, wherein
   a recess is formed in the interlayer insulation film in a wide portion of the end part of the gap;
   the void extends toward the end part of the gap, and at an unspecified point on the end part the void opens on a top part thereof and changes into the recess.

6. A method for manufacturing an integrated circuit having a wiring layer laminated on a substrate and having a pattern in which is formed a gap for forming a narrow trench and a wide open part contiguous with the gap, and an interlayer insulation film built up so as to cover the wiring layer, the method comprising:

a wiring layer patterning step for patterning the wiring layer laminated on the substrate, and forming the pattern in which a corner part is present in a portion in which the gap and the open part are connected, the corner part is chamfered, and an end part of the gap is formed in a shape that widens toward the open part, wherein the chamfered corner part has a first edge parallel to the narrow trench, a second edge that is facing the wide open part and is perpendicular to the first edge, and a slanted edge diagonally crossing each of the first edge and the second edge; and
   monotonically increasing a width part of the gap adjacent to the slanted edge at a position along the gap as the position moves closer to a boundary of the open part defined by an extended line of the second edge.

7. The method for manufacturing an integrated circuit of claim 6, comprising an interlayer insulation film laminating step for laminating on the patterned wiring layer the interlayer insulation film of a film thickness at which all of the gap except the end part is buried beneath the interlayer insulation film.

8. The method for manufacturing an integrated circuit of claim 7, wherein
   the end part of the gap expands toward the open part up to a width at which the built-up interlayer insulation film forms an indentation inside the gap.

9. An integrated circuit comprising:
   a wiring layer laminated on a substrate and having a pattern in which is formed a gap for forming a narrow trench and a wide open part contiguous with the gap; and
   an interlayer insulation film built up so as to cover the wiring layer, wherein
   the pattern of the wiring layer has a corner part present in a portion in which the gap and the open part are connected, the corner part is chamfered to form an end part of the gap into a shape that widens toward the open part;
   the interlayer insulation film is laminated to a thickness at which all of the gap except the end part is buried beneath the interlayer insulation film;
   the interlayer insulation film that has the laminated thickness forms a recess inside the open part;
   the end part of the gap expands toward the open part up to a width at which the built-up interlayer insulation film that has the laminated thickness forms an indentation inside the gap, the indentation leads into the recess formed inside the open part;
   the chamfered corner part has a first edge parallel to the narrow trench, a second edge that is facing the wide open part and is perpendicular to the first edge, and a slanted edge diagonally crossing each of the first edge and the second edge; and
   a width of a part of the gap adjacent to the slanted edge at a position along the gap monotonically increases as the position moves closer to a boundary of the open part defined by an extended line of the second edge.

10. The integrated circuit of claim 9, wherein
    a thickness of the interlayer insulation film is more than one-half of a width of the gap except the end part; and
    the end part of the gap expands up to a width of more than twice of the thickness of the interlayer insulation film.

* * * * *